(12) United States Patent
Yousif et al.

(10) Patent No.: US 8,325,076 B2
(45) Date of Patent: Dec. 4, 2012

(54) TIME-TO-DIGITAL CONVERTER

(76) Inventors: Abdel-Fattah S. Yousif, Calgary (CA);
James W. Haslett, Calgary (CA)

(*) Notice: Subject to any disclaimer, the term of this patent is extended or adjusted under 35 U.S.C. 154(b) by 1451 days.

(21) Appl. No.: 11/853,446

(22) Filed: Sep. 11, 2007

(65) Prior Publication Data
US 2008/0267280 A1 Oct. 30, 2008

(51) Int. Cl.
*H03M 1/50* (2006.01)
(52) U.S. Cl. ......................... 341/166; 341/155
(58) Field of Classification Search .................. 341/166, 341/167, 118, 157
See application file for complete search history.

(56) References Cited

U.S. PATENT DOCUMENTS

| 6,549,859 | B1 * | 4/2003 | Ward | 702/66 |
| 6,868,047 | B2 * | 3/2005 | Sartschev et al. | 368/118 |
| 7,872,602 | B2 * | 1/2011 | Chen | 341/166 |

OTHER PUBLICATIONS

Newport, D.F. et al., "Coincidence Detection and Selection in Positron Emission . . . etc.", IEEE Transactions on Nuclear Science, Feb. 1989, pp. 1052-1055, vol. 36(1).
Tetrault, M.-A. et al., "Real Time Coincidence Detection Engine for High Count Rate . . . etc.", IEEE Transactions on Nuclear Science, Feb. 2010, pp. 117-124, vol. 57(1).
Martinez, J.D., "High-Speed Data Acquisition and Digital Signal Processing System . . . etc.", IEEE Transactions on Nuclear Science, Jun. 2004, pp. 407-412, vol. 51(3).
Crosetto, D.B., "System Design and Verification Process for LHC Programmable Trigger Electronics", Nuclear Science Symposium Conference Record, Oct. 1999, pp. 279-286, vol. 1.
Moses, W.W., et al. "Prospects for Time-of-Flight PET using LSO Scintillator", IEEE Transactions on Nuclear Science, Jun. 1999, pp. 474-478, vol. 46(3).
Shah, K.S., et al., "LaBr3: CE Scintillators for Gamma-Ray Spectroscopy", IEEE Transactions on Nuclear Science, Dec. 2003, pp. 2410-2413, vol. 50(3).
Paschalidis, N. et al., "A CMOS Time-of-Flight System-on-a-Chip for Spacecraft Instruments", IEEE Transactions on Nuclear Science, Jun. 2002, pp. 1156-1163, vol. 49(3).
Staszewski, R.B. et al., "1.3V 20ps Time-to-Digital Converter for Frequency Synthesis in 90-nm CMOS", IEEE Transactions on Circuits and Systems, Mar. 2006, pp. 220, 224, vol. 53(3).
Dudek, P. et al., "A High-Resolution Cmos Time-to-Digital Converter Utilizing a Vernier Delay Line", IEEE Transaction on Solid-State Circuits, Feb. 2000, pp. 240-24, vol. 35(2).
Raisanen-Rutsalainen, E. et al., "An Integrated Time-to-Digital Covnverter with 30-ps. Single-Shot Precision", IEEE Journal of Solid-State Circuits, Oct. 2000, pp. 1507-1510, vol. 35(10).
Swann, B.K. et al., "A 100-ps. Time-Resolution CMOS Time-to-Digital Converter . . . etc.", IEEE Journal of Solid-State Circuits, Nov. 2004, pp. 1839-1852, vol. 39(11).

(Continued)

*Primary Examiner* — Brian Young
(74) *Attorney, Agent, or Firm* — Frank J. Dykas; Scott D. Swanson; Dykas & Shaver, LLP

(57) ABSTRACT

A Time-to-Digital Converter (TDC) is constructed using simple digital delay circuits. The design uses a clock compensation scheme to modify and adjust the TDC's operation under integrated circuit fabrication process variations. The TDC design is based on a novel digital processing algorithm that produces one conversion every clock cycle. Therefore, this TDC is the "first" single cycle latency TDC targeted at high speed circuit applications such as (but not limited to) time-based Analog to Digital Converters (ADCs) for direct analog to digital conversion of radio frequency signals in wireless communication systems and high speed signal measurement applications. Due to its hierarchical design approach, the TDC design uses an optimized number of delay circuits and therefore requires very little power consumption and silicon area.

23 Claims, 9 Drawing Sheets

OTHER PUBLICATIONS

Hwang, C-S. et al., "A High-Precision Time-to-Digital Converter Using . . . etc." IEEE Transaction on Nuclear Science, Aug. 2004, pp. 1349-1353, vol. 51(4).

Gerds, E.J. et al., "A CMOS Time to Digital Converter IC with 2 Level Analog CAM", IEEE Journal of Solid-State Circuits, Sep. 1994, pp. 1068-1076, vol. 29(9).

Arai, Y. et al., "A Time Digitizer CMOS Gate-Array with a 250 ps Time Resolution", IEEE Journal of Solid-State Circuits, Feb. 1996, pp. 212-221, vol. 31(2).

Kurd, N.A. et al., "Multi-GHz Clocking Scheme for Intel Pentium 4 Microprocessor", IEEE International Solid-State Circuit Conference, 2001.

Yousif, A.S. et al., "A Fine Resolution TDC Architecture for Next Generation PET Imaging", IEEE Transactions on Nuclear Science, Oct. 2007, pp. 1574-1582, vol. 54(2).

* cited by examiner

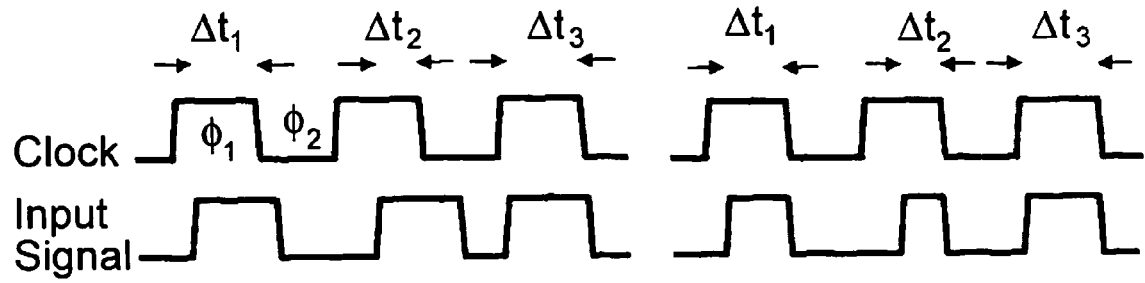
FIG. 1A
PRIOR ART
FIG. 1B
PRIOR ART
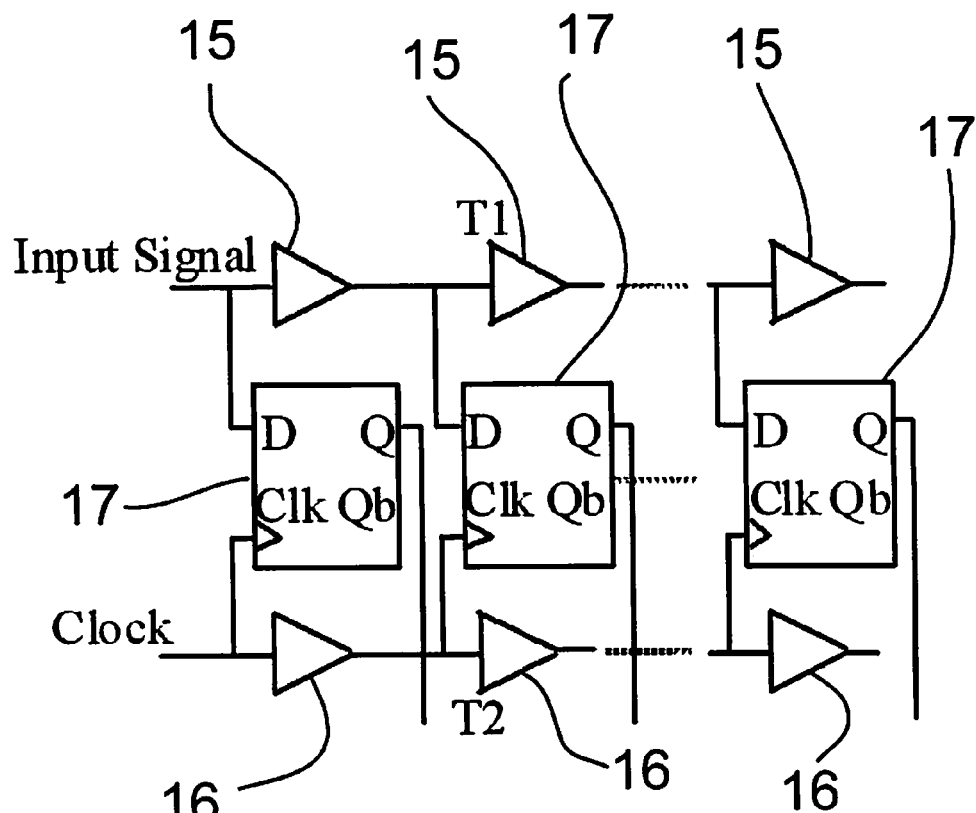
FIG. 2
PRIOR ART

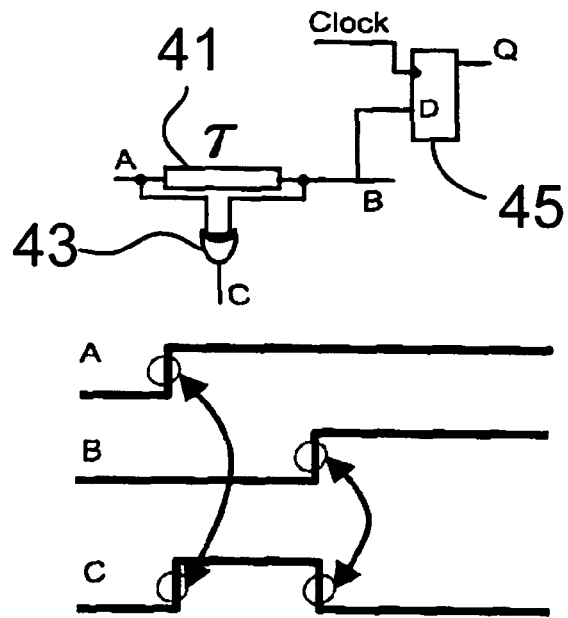
FIG. 7
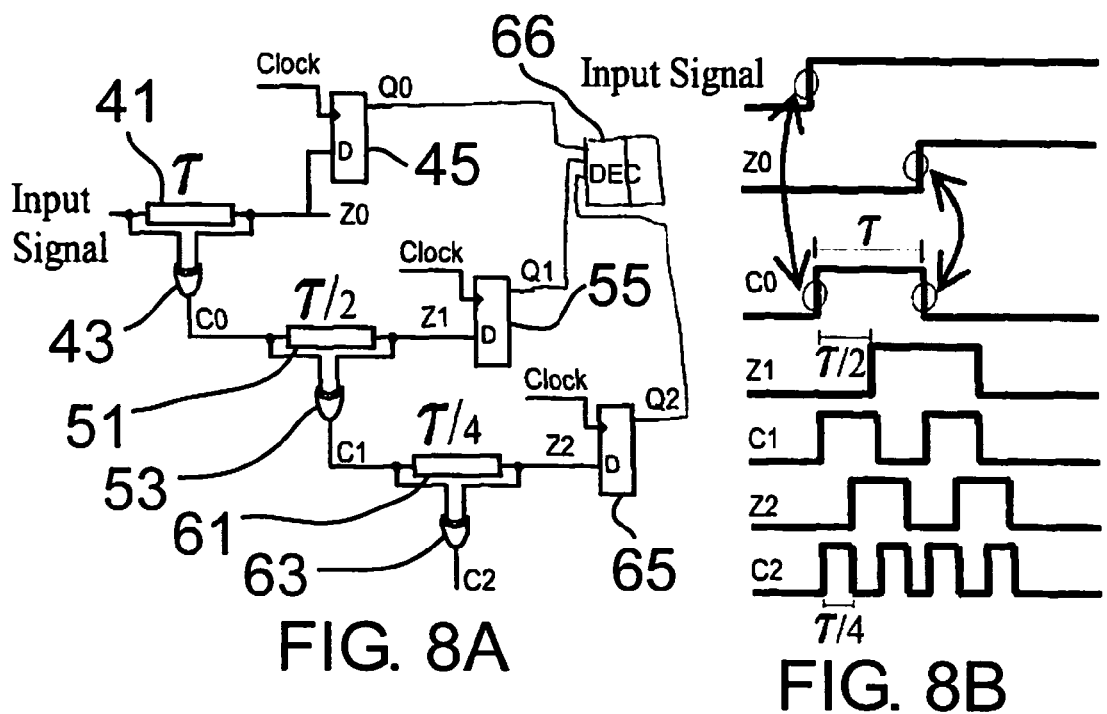
FIG. 8A
FIG. 8B

TIME-TO-DIGITAL CONVERTER

BACKGROUND

The function of a time-to-digital converter (TDC) is to convert the "time difference" between the two rising edges of a reference clock and a digital signal into a digital word. The reference clock and the digital signal are running at the same frequency but the rising edges are shifted in the time domain. FIGS. 1A and 1B show two prior art examples of input signals to a TDC. The TDC translates the time differences $\Delta t_1$, $\Delta t_2$, and $\Delta t_3$ into digital words. The resolution of a TDC is defined by the number of bits in each digital word.

The TDC's latency or conversion time per sample is the number of clock cycles the TDC takes to complete one data conversion, i.e., converting the time delay between the rising edges of its two inputs into digital data. Latency can be one or more clock cycles. Low latency is important in applications such as ADC's in high speed communications circuits and high speed measuring equipment. Because existing TDC designs are tuned for applications that require large latencies, they are not suitable for high speed and critical applications covered by this invention. The latency in most existing TDC designs is variable and is a function of the actual time difference that needs to be measured between two inputs. Time-based high sample rate ADC designs can only be realized with high speed, fixed latency TDCs.

High accuracy Time-to-Digital converters (TDC's) serve as the core circuit of many precise instrumentation systems or equipment, such as Frequency Modulation (FM) or Phase Modulation (PM) demodulators, logic analyzers, time-of-flight detectors and laser rangers. TDCs can also be used with a Voltage-to-Time converter (VTC) at the front-end to build high speed Analog-to-Digital converters (ADCs). In general, TDCs can be used in data acquisition systems to capture and correlate events that occur at different time instances. The TDC measures the difference in time between these events. The maximum resolution of the measured time difference defines the TDC architecture. In most applications (non-ADC), the time difference covers a wide range (from 1 ns to 1000s of nanoseconds). As a result, TDC architectures existing today were built around variable TDC latency and wide dynamic range. Unfortunately, such architectures are not suitable for applications such as digital ADCs, where a fixed latency, high resolution and high speed of operation are needed. Historically, time-based ADC designs use digital counters to count the number of pulses coming out of the VTC block. Such architectures have many limitations, such as severely limited ADC sampling rate, limited bit resolution, poor scaling opportunities with process technology and relatively high power consumption. Time-based ADCs are not common today because of these limitations.

A simple fixed latency TDC commonly found in literature is shown in FIG. 2. The two events, from which a time difference measurement is sought, are the rising edges of the input signal and the clock. The basic circuit components used in that architecture are delay elements 15 and 16 and signal latches 16. A delay element preserves the shape of its input signal but pushes the signal edges (rising and falling edges) in the time domain by an amount $T_1$ (delay element 15) or $T_2$ (delay element 16). The delay elements are not clocked. The TDC's "time resolution" is defined as the minimum measurable time difference between $T_1$ and $T_2$ ($T_1$ is slightly larger than $T_2$).

The TDC in FIG. 2 operates by comparing the input signal level along the delay line with the clock delay line, point for point. At some point along the delay line, the latch outputs will register a transition from logic '1 value to logic '0 value. A decoder (not shown in FIG. 2) reads the outputs from the latches and produces the corresponding output bits (digital word), based on the location of the latch where the signal value transition occurred. Theoretically, this architecture achieves all the requirements needed to build a time-based ADC. Practically, there are some fundamental problems in implementing this architecture. These problems can be summarized in the following points.

This architecture depends on the accuracy of the "difference" in the delay resolution of delay lines along the signal and the clock paths. A small variation in $T_1$ or $T_2$ causes gross errors in the results since all output bits (MSB down to the LSB) have equal chances of being wrong due to process technology variations. Even though the TDC has a fixed latency, it will take multiple clock cycles to traverse the delay lines on the clock and signal path. This is a drawback since critical ADC applications require single cycle latency. The number of delay elements and latches grows exponentially with the number of the TDC's bit resolution. For instance, if the TDC's bit resolution is n bits, the TDC would need $2 \times 2^n$ delay elements and $2^n$ latches. The decoder complexity increases exponentially with the number of TDC resolution bits.

In FIG. 2, the number of delay elements/steps needed to complete one conversion is $2^n$, where n is the number of resolution bits for the TDC. Therefore, a single conversion takes $2 \times 2^n \times T_1$ ns to complete. The "2" factor in this equation accounts for the low phase cycle of the clock (assuming 50% duty cycle), since data conversion occurs during the clock's active phase. It is easy to see that such a TDC requires more than one clock cycle to complete one conversion as n increases.

SUMMARY

In one embodiment, a novel TDC architecture is presented that deals with solving the above issues by moving from flat delay resolution to hierarchical delay resolution architecture. The proposed TDC may have a fixed latency of one clock cycle. To achieve one cycle conversion, a first part of the clock cycle is used for a delay propagation stage, and a second part of the clock cycle is used for decoding. In one embodiment, instead of applying equal delay amounts to the signal and the clock, the delay algorithm applies hierarchical delay amounts, which may start with the highest delay possible and then trickle down to the lowest possible delay. The novel TDC architecture opens the door for a new generation of ADC designs as well as other applications.

BRIEF DESCRIPTION OF THE FIGURES

There will now be described embodiments of a novel TDC architecture, with reference to the figures, in which:

FIGS. 1A and 1B show respectively input signal definition for (A) fixed pulse width input and (B) Pulse Width Modulated (PWM) signal input;

FIG. 2 shows a prior art TDC architecture;

FIG. 7 shows an embodiment of a delay cell design;

FIG. 8A shows a timing diagram of resolution level interaction;

FIG. 8B shows signals at specific points of FIG. 8A;

DETAILED DESCRIPTION

A time to digital converter (TDC) system is described in relation to FIGS. 1-12. Digital inputs are connected to a two phase delay propagation and decoding circuit structure. The outputs of the delay propagation stage are time stamped with the falling edge of a clock and are fed to the decoding logic which processes the time stamped data in the second phase of a clock and produces the outputs of the TDC system. In an embodiment of the TDC, a hierarchical, multi-layer hardware delay algorithm is applied to the non-clock input signal. The delay resolution of a delay layer in one hierarchy level can be any fraction (one half is used in the example given below) of that of the consecutive delay hierarchy level. In certain embodiments, the number of hierarchy levels is scalable with semiconductor process technology, and the number of TDC output bits.

In an embodiment of the delay propagation stage, signal transition edges are created as a signal propagates through the multi-layer delay propagation structure. Each signal transition is used as a measure of how close the falling edge of a signal is to the falling edge of the reference clock. Signal edges may be time stamped by registering their logic level (for example a "0" level or a "1" level) at the falling edge of the clock. A hierarchical logic decoder consolidates the outputs from all delay hierarchy levels and resolves them into digital outputs. The digital inputs to the TDC may be a delay modulated signal and reference clock, and the outputs may be a digital bit stream representing the digital value of the time difference between the two digital input signals.

Figures 3A, 3B:
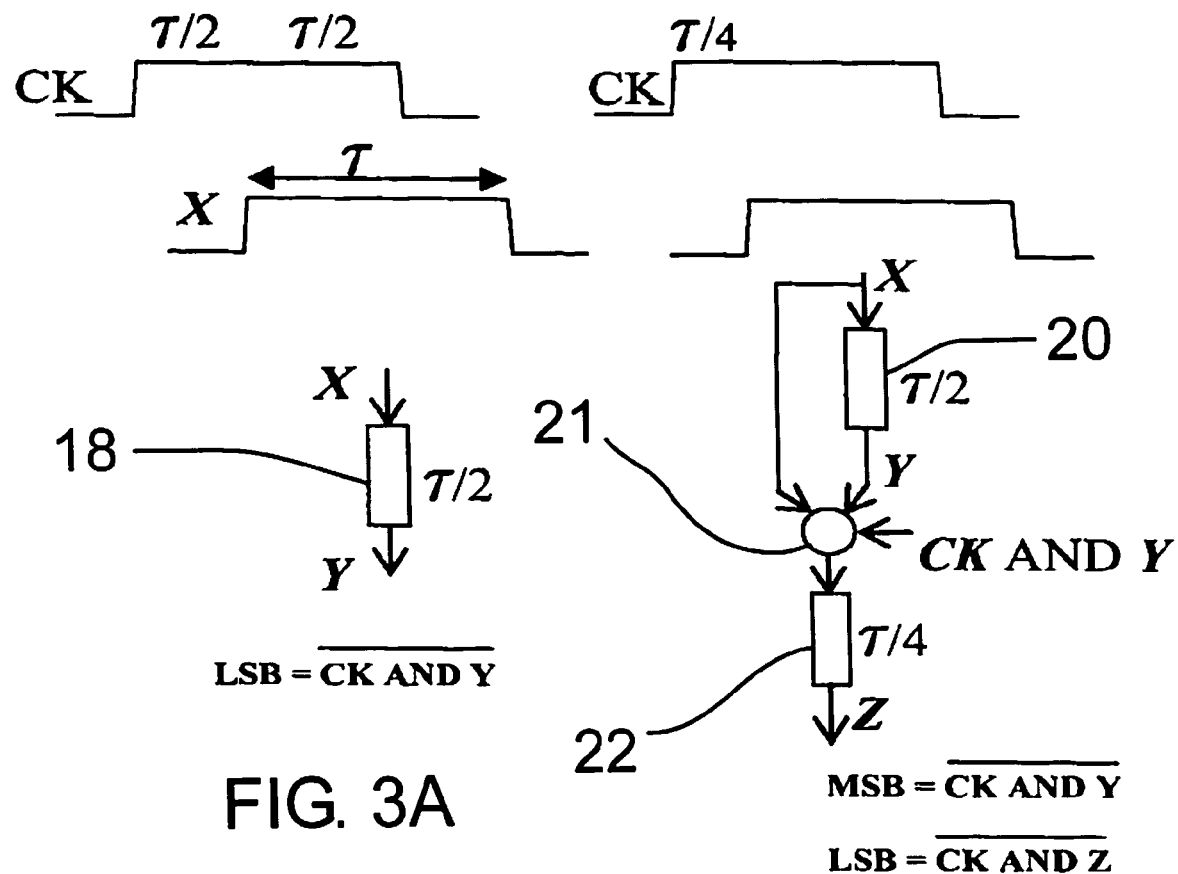
FIG. 3A shows a signal processing algorithm for a 1 bit TDC.
FIG. 3B shows a signal processing algorithm for a 2 bit TDC.

FIGS. 3A and 3B illustrate signal processing steps used in an embodiment of a delay propagation algorithm of a TDC converter. In FIG. 3A, a 1-bit TDC can be achieved by finding out the position of the rising edge of the input signal relative to the falling edge of the clock. A delay element 18 with a resolution equal to half the clock's active period is used. If the signal edge is within the first half of period $\tau$, the TDC generates a '0 as an output; otherwise it will generate a '1. FIG. 3B shows a 2-bit TDC signal processing algorithm, where $\tau$ is now divided into four time segments, each with a $\tau/4$ resolution. The algorithm first applies a $\tau/2$ delay with delay element 20 to the signal and determines in decision block 21 if the delayed signal rising edge still is within the active phase of the clock or not. This operation is modeled as the logical operation "Clock AND Y". The result from that operation is used to determine the most MSB (Most Significant Bit) output from the TDC. It is also used to determine which signal, X or Y, to pass to the next delay level in the algorithm. If the result of the logic operation is '1, the MSB bit is assigned a '0, as the rising edge of the input signal was in the first half of the clock period $\tau$. It also means that the delayed signal Y has its edge within the second half of the clock period $\tau$. Therefore, the algorithm passes the delayed signal Y to the next level. On the other hand, if the result from the logic operation is '0, the delayed signal Y will have its rising edge beyond the clock's active phase, effectively losing the signal. In that case, the algorithm passes signal X to the next level of delay resolution and assigns a '1 to the MSB. The LSB bit is determined after applying the output signal from decision block 21 to a delay element 22 with half the resolution of that in delay element 20. The value of the LSB is determined by capturing the logic level of signal Z during the active phase of the clock.

Figure 4:
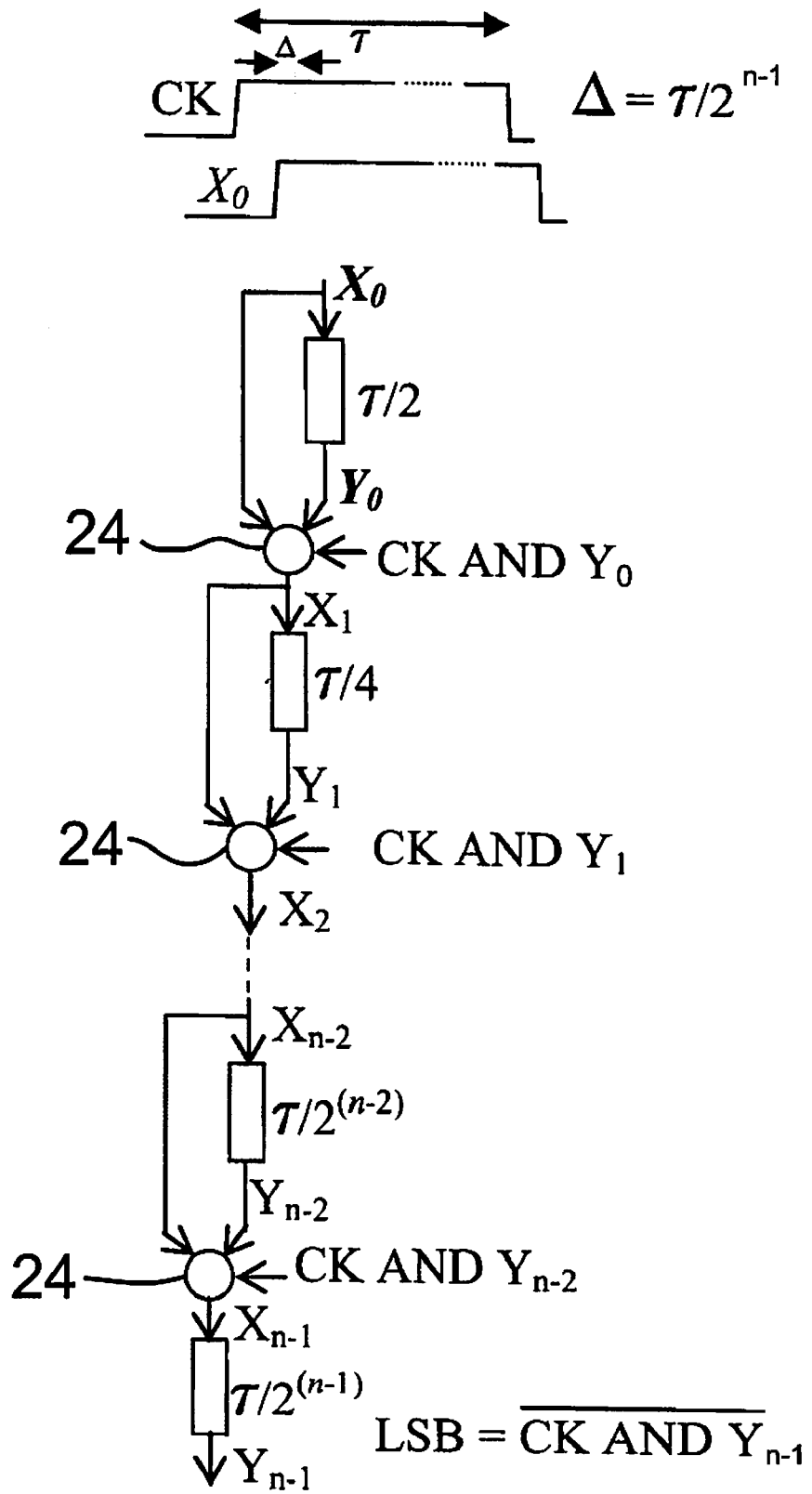
FIG. 4 shows a signal processing algorithm for an n-bit TDC.

An expanded view of a signal processing algorithm for a multi-bit TDC is shown in FIG. 4. FIG. 4 has N levels of delay hierarchy with delay elements $\tau/2$, $\tau/4$, etc and decision making blocks 24 separating them. As shown in FIG. 4, at any level of delay hierarchy, a signal and its delayed version from the previous level are presented as inputs. The decision blocks 24 use the TDC bits generated from previous levels ("CK AND $Y_1$", "CK AND $Y_2$", . . . , "CK AND $Y_{n-1}$") to determine which signal to proceed with and feed to the current delay hierarchy level. The TDC output bit at each level is also generated using the "CK AND $Y_i$" term, where i is the hierarchy level. It should also be noted that only the input signal is processed through the delay algorithm. The clock is used only as a reference in the decision making blocks.

Figures 5A, 5B:
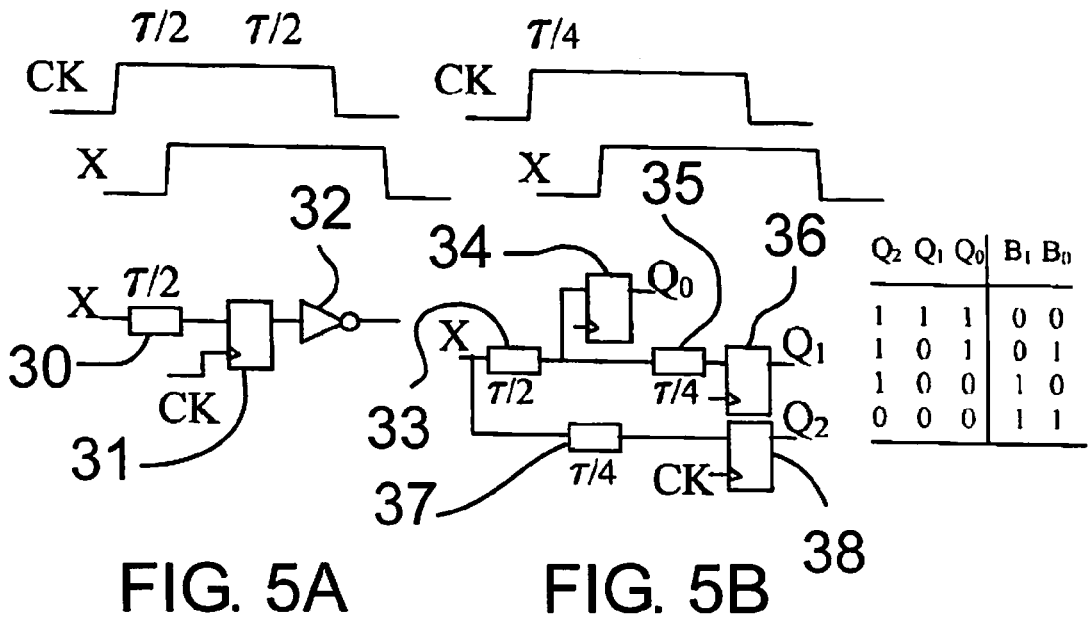
FIG. 5A shows a 1 bit TDC implementation.
FIG. 5B shows a 2 bit TDC implementation and includes a truth table for the 2 bit TDC implementation.

In order to evaluate the implementation complexity of this algorithm, example implementations of 1-bit and 2-bit TDCs are shown in FIGS. 5A and 5B. A 1-bit implementation requires one delay element 30 with a delay resolution equal to $\tau/2$. It also requires a latch 31 to capture the state of the delayed signal relative to the clock and an inverter 32 to generate the output TDC bit. The TDC output is simply the inverse of the latch output. In a 2-bit implementation, two delay resolution levels and a signal routing block (decision making block) are needed. A key issue with the implementation of a signal routing block is the delay it will introduce into the decision tree, given the fact that it uses the result from a previous delay level to control the data feeding the current one. Such an added delay would prevent us from achieving a TDC design with single cycle latency. A way to avoid an implementation with a decision block is to exhaust all possible paths in the decision tree at the expense of adding complexity to the decoding logic and increasing the hardware implementation requirements. To highlight this further, FIG. 5B shows an implementation where the signal routing block is replaced by exhausting all possible signal path combinations. The upper path represents a situation where the input signal edge falls within the first half of the clock's active phase. The upper path includes a delay element 33, latch 34 with output $Q_0$, delay element 35 and latch 36 with output $Q_1$. The lower path is the opposite situation where the input signal edge falls within the second half of the clock's active phase. The lower path has an initial delay element 37 with delay amount $\tau/4$, that is, less than the delay of delay element 33 otherwise the signal will be lost, and latch 38 with output $Q_2$. In order to produce the 2 bits output, a decoder must be used to decode the latch outputs (Q0, Q1, and Q2) into 2 bits (B0 and B1). The truth table for such a decoder is also shown in FIG. 5B. It is important to note at this point that every signal routing block replacement results in creating two possible paths. The complexity of the delay structure and decoder increases dramatically with the number of output bits. The growth in the number of blocks is exponential and the decoder's number of inputs will increase at the same rate as well. Such an implementation was given to illustrate how the algorithm works.

Figure 6:
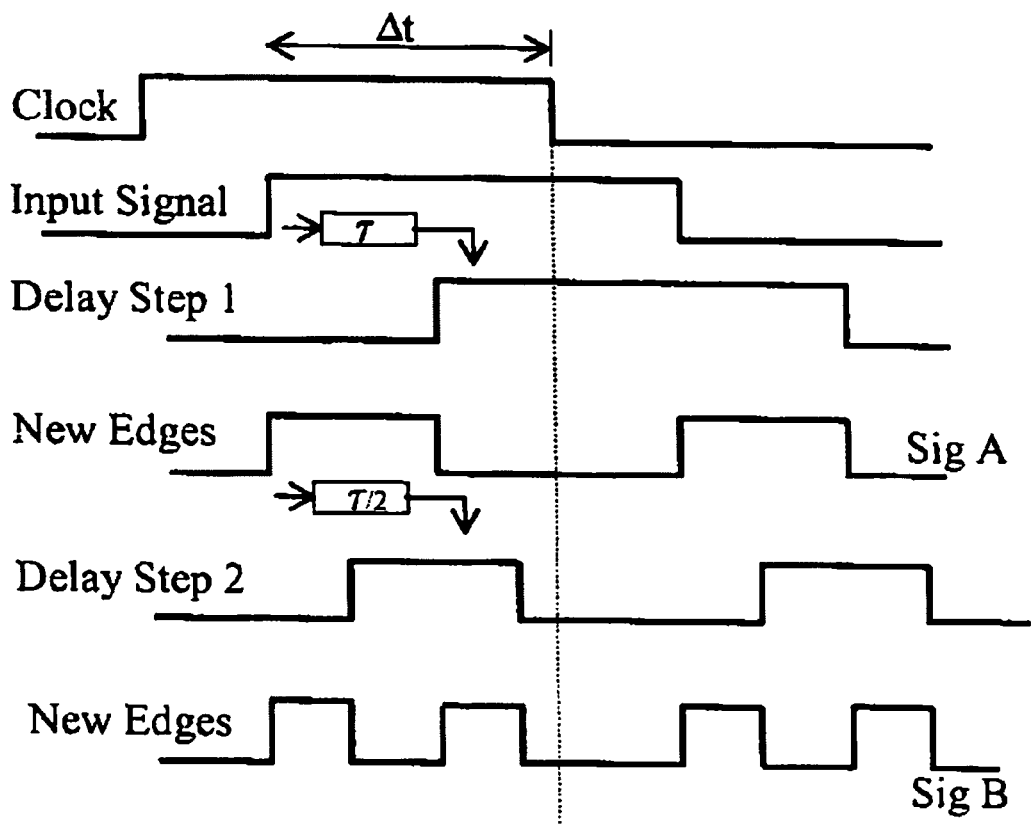
FIG. 6 shows a delay and edge generation procedure.

In the TDC implementation of FIG. 6 the signal routing block of FIG. 4 is split into two functions; namely signal edge generation and post process signal decoding. Instead of making signal routing decisions as the signal propagates, signal edges are created to coincide with the rising edges of a signal and its delayed version. FIG. 6 shows an example of signal delay and edge creation. The time difference $\Delta t$ is being measured through a series of delay and edge generation steps. The number of delay steps and delay values follow the same algorithm described in the previous section. As FIG. 6 shows, after a signal is delayed, new edges (pulses) that correspond to the input and output (delayed) signal edges are created. Such a signal holds the history of all edge transitions that has occurred during the input signal propagation up to that particular point in the delay structure. For instance, the input signal in FIG. 6 has one rising edge and one falling edge. Signal "Sig A" can be generated from the input signal and its delayed version. "Sig A" has two rising edges and two falling edges (two pulses). The first pulse corresponds to the rising edge of the input signal and the rising edge of the input signal delayed by $\tau$. The other pulse corresponds to the falling edge of the input signal and the falling edge of the input signal delayed by $\tau$. Similarly, after another delay step, "Sig B" can be generated where the history of all edge transitions is preserved. The width of the pulses of "Sig B" is half that of "Sig A", while the number of pulses has doubled due to the hierarchical delay resolution algorithm.

Logic states are also generated for these signal edges ("Sig A" and Sig B") at the falling edge of the clock. When these states are compared, in a post process decoding step, the location of the signal edge of the input signal relative to the falling edge of the clock can be determined. It is important to mention at this point that signal transitions that occur beyond the clock's falling edge can be ignored because their logic state will not be captured. With this fact in mind, it is evident from FIG. 6 that a full delay propagation of an input signal through a hierarchical delay structure can be achieved within the one half clock cycle (during the clock's active phase). The logic state decoding can be accomplished during the in-active phase of the clock. In all, a full data conversion can be achieved in one clock cycle.

FIG. 7 shows a proposed delay cell design that achieves this function. The delay cell design has three distinct sub-functions, namely, delaying an input signal by a fixed time value using delay element 41 with delay resolution equal to $\tau$ capturing the state of the output signal when the clock is active, and creating a pulse with its rising edge corresponding to the input signal and its falling edge corresponding to the delayed signal. Creating the two edges can be achieved using an XOR gate 43. The state of the delayed signal relative to the clock may be captured using a latch 45. The latch output signal Q is fed to a decoder for post processing. Post processing is done in the low phase of the clock, and therefore does not add any timing overhead during the signal propagation phase (which occurs while the clock is active). In FIG. 7, signal A is the input signal, B is the delayed version of the input signal with delay $\tau$ and C is the output from gate 43. The arrows in the signal portion of the figure show corresponding portions of the signals.

FIG. 8A shows an implementation of the proposed signal processing algorithm using the new delay cell design, and FIG. 8B shows the signals at various points of FIG. 8A. The design of FIG. 8A has a hierarchy of cells. A first cell with delay element 41, latch 45 and gate 43 functions as the cell in FIG. 7 to produce outputs Q0, Z0 and C0. Signal C0 becomes the input to the cell comprising delay element 51, latch 55 and gate 53, which functions in like manner to produce outputs Q1, Z1 and C1. Signal C1 becomes the input to the cell comprising delay element 61, latch 65 and gate 63, which functions in like manner to produce outputs Q2, Z2 and C2.

An input signal edge feeding the delay structure will cause a unique signature pattern to be generated across the different delay hierarchies. This signal pattern is unique to that structure. The clock is intentionally not shown in the timing diagram to emphasize that the clock's timing does not determine the signal pattern of the delay structure. The signal pattern is determined by the delay values and the number of delay hierarchy levels. The clock's function is to sample the signal pattern and create logic states Q0, Q1 and Q2 on the latch outputs, which will be fed to a decoder 66. It is imperative to see that there are signal edges around every possible edge before and after a signal is delayed.

The truth table for the decoder is shown in Table 1. Each delay hierarchy generates one bit. The decoding process is convoluted because the interpretation of latched data in one level of hierarchy depends on data from higher levels of hierarchy. To illustrate this point, two examples of data decoding, based on FIG. 8A, are shown in FIGS. 9 and 10.

Figure 9:
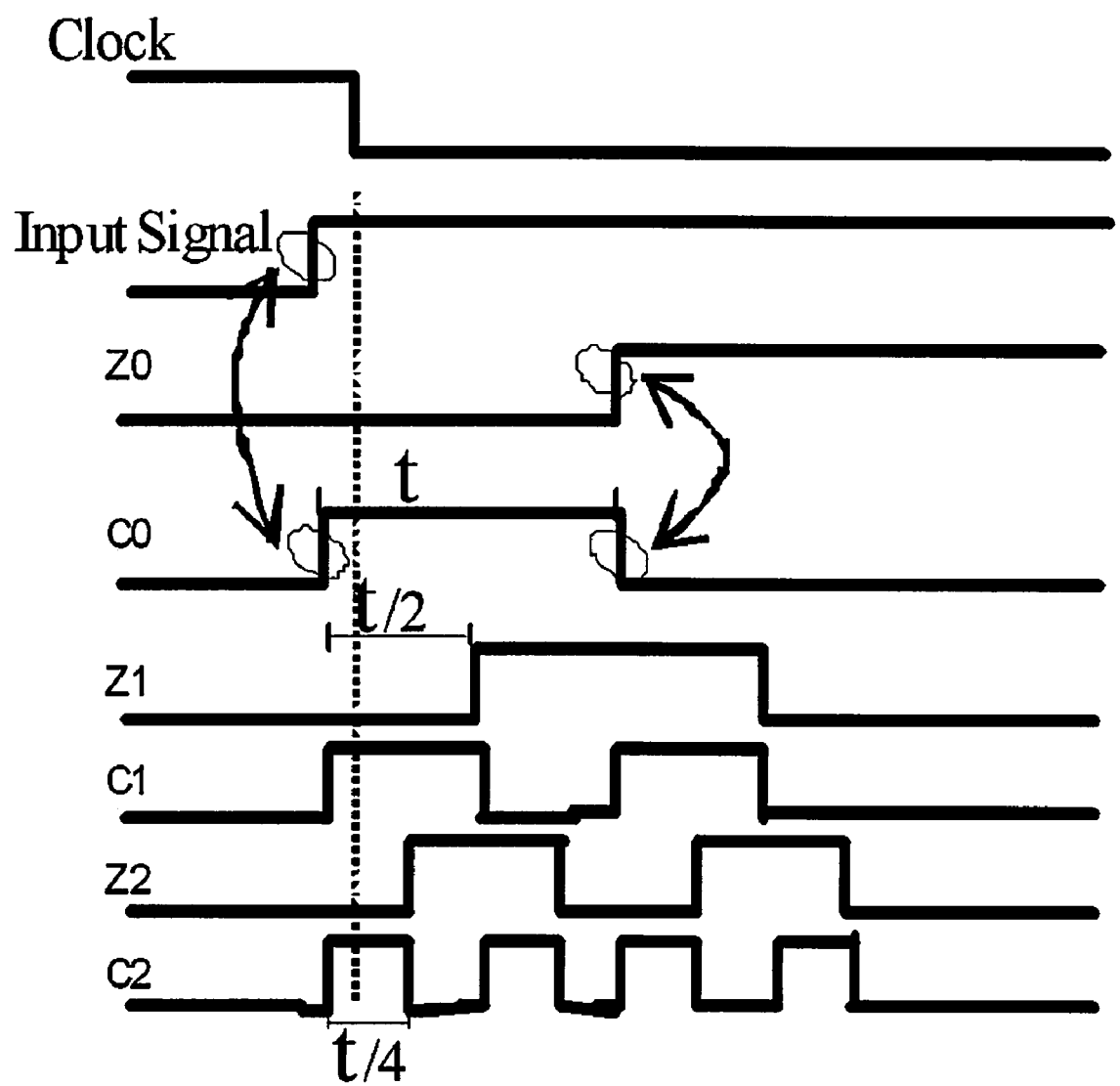
FIG. 9 shows an embodiment of a hierarchical resolution timing diagram.

In FIG. 9, the latched data sequence $Q_2Q_1Q_0$ is '000 (since Z2, Z1, and Z0 have '0 logic value at the falling edge of the clock). The decoder for $Q_0$ is straightforward with no dependencies on other data. Logic '0 indicates that the input signal's rising edge is close to the clock's falling edge, i.e., there is a large time difference between the rising edges of the clock and the input signal. Therefore, the output (MSB) is assigned a '1. $Q_1$ also registers a '0, which indicates that even a smaller delay pushes the input signal's rising edge beyond the clock's active area. Because $Q_0$ is also a '$_0$, it is imperative to interpret the data "around the input signal's rising edge". Therefore, a '00 reading for $Q_1Q_0$ will be translated into an output '1 for the second output bit. Similarly, a '0 reading on $Q_2$ (given that $Q_1Q_0$ also have a '00 reading) will be decoded as '1.

Figure 10:
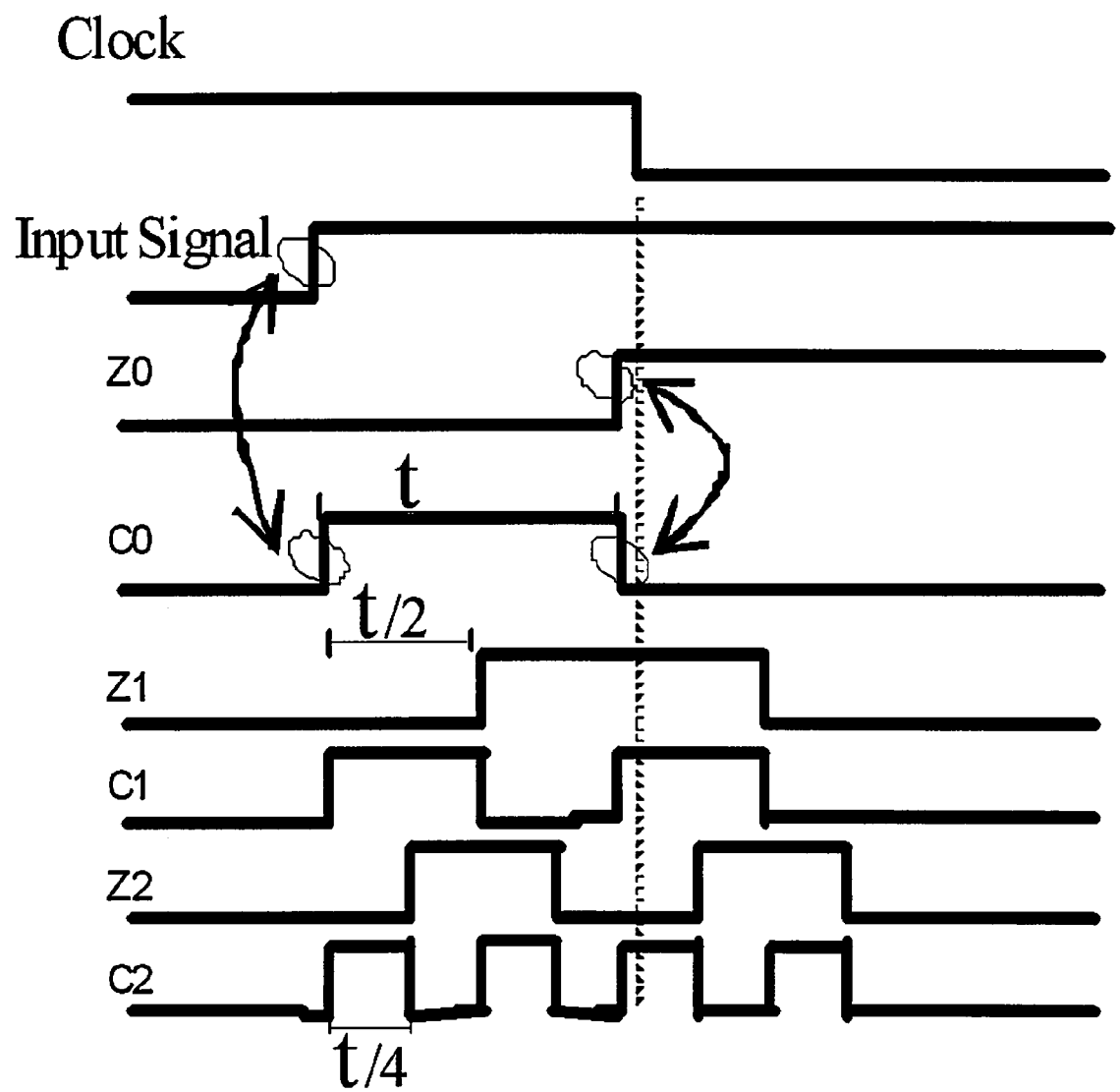
FIG. 10 shows another embodiment of a hierarchical resolution timing diagram.

In FIG. 10, the latched data sequence is '011 ($Q_2Q_1Q_0$). The MSB will be assigned a '0 in this case. Since $Q_0$ is '1, the interpretation of data should now be done "around the rising edge of the delayed signal (Z0)". In this case, a reading of '1 on $Q_1$ actually means that signal Z1 is pushed out beyond the clock's active area (unlike the interpretation in the previous example). Therefore, the second output bit should be assigned a '1. With $Q_1Q_0$ having '11, the '0 reading on $Q_2$ is interpreted as a '1 at the output. The output sequence will be '011.

As shown in these two examples, decoding the data of the hierarchical resolution structure involves some intuition into the interactions between different cell resolution hierarchies. The decoder's main function is to track the last valid edge, where a delayed signal rising edge exists within the clock's active area. Based on that edge, data interpretation is done to produce the TDC's output bits.

The delay structure in FIG. 8A supports a 3-bit TDC design, with the first delay processing level having the lowest delay resolution and the last delay processing level having the highest delay resolution. In general, the lower limit on the highest delay resolution is determined by the process technology, i.e., the minimum delay achievable at a certain process line width. On the other hand, the lowest resolution is limited by the clock frequency. Therefore, the structure is tunable and can be adjusted based on the process technology and the required bit resolution. At low clock frequencies (less than 100 MHz), large delay blocks at the first few delay hierarchies may be needed to implement the TDC architecture.

Figure 11:
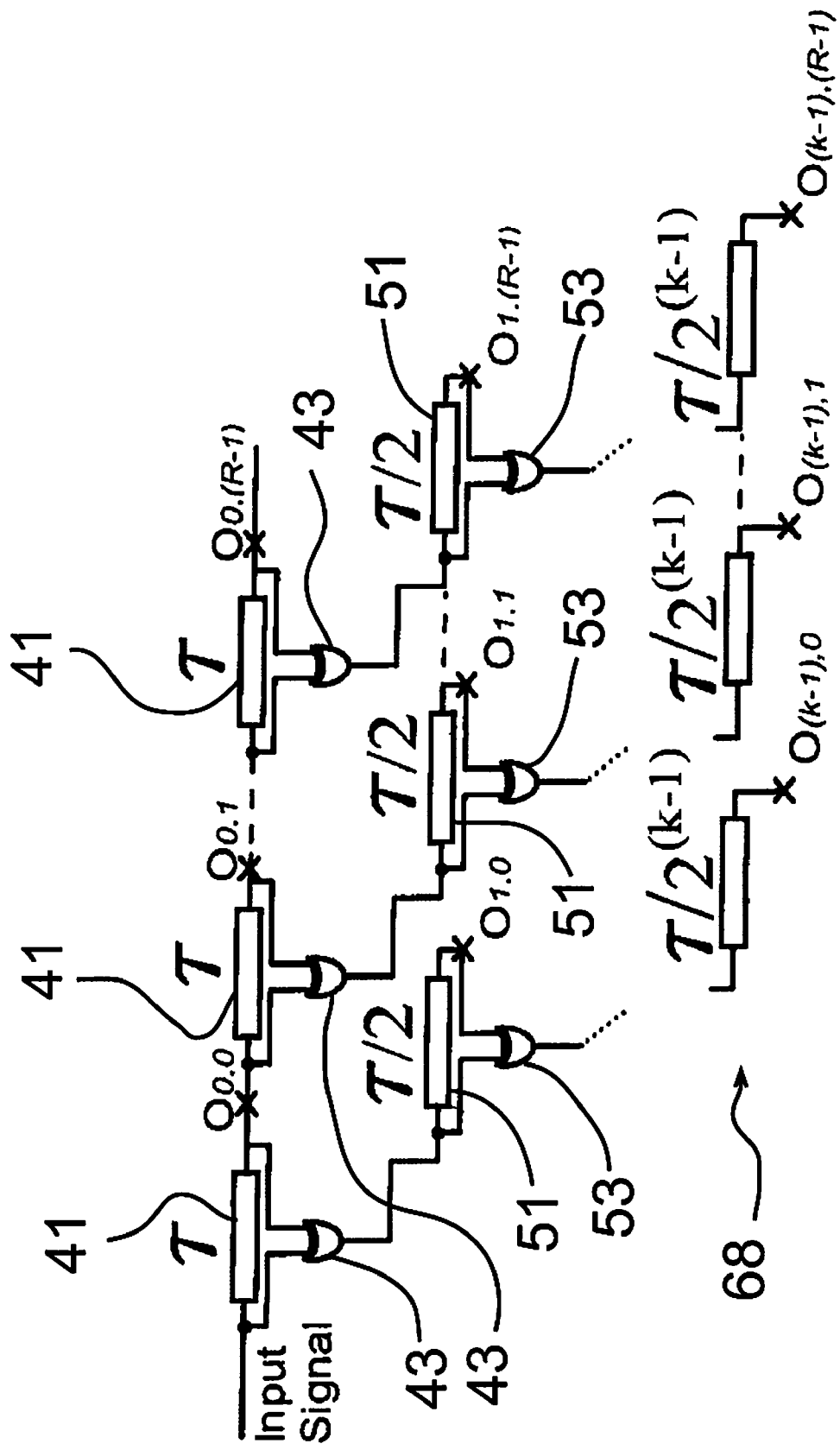
FIG. 11 shows an embodiment of a signal propagation and edge creation structure.

In order to avoid building the TDC using large delay blocks, FIG. 11 shows a further embodiment of the TDC. The final TDC architecture splits the lowest resolution level into time segments and then processes each segment using a separate delay propagation slice as shown in FIG. 11. For clarity, the latches are not shown here. At the top row, the input signal propagates through a number of delay elements 41 that are connected serially and that have corresponding gates 43 that function as described in relation to FIG. 7. Each delayed output ($O_{1,0}$ through $O_{1,(R-1)}$) is connected to a latch. Therefore, each delayed output is timed against the clock feeding the latch corresponding to that delay element. The latch outputs are then fed to a decoding block which determines the first r bits of the TDC output. These bits constitute the MSB for the TDC. Similarly, the outputs from the gates 43 are fed into cells with delay elements 51 and corresponding gates 53. The delay elements 51 have delay $\tau/2$ and the delayed output ($O_{1,0}$ through $O_{1,(R-1)}$) is also connected to a latch. The outputs from the gates 53 are then fed into successive rows of cells with delay elements having smaller and smaller delay until the final row 68. The delayed outputs in the remaining rows are also connected to a latch. The latch outputs are then fed to a decoding block which determines the remaining bits of the TDC output.

Figure 12:
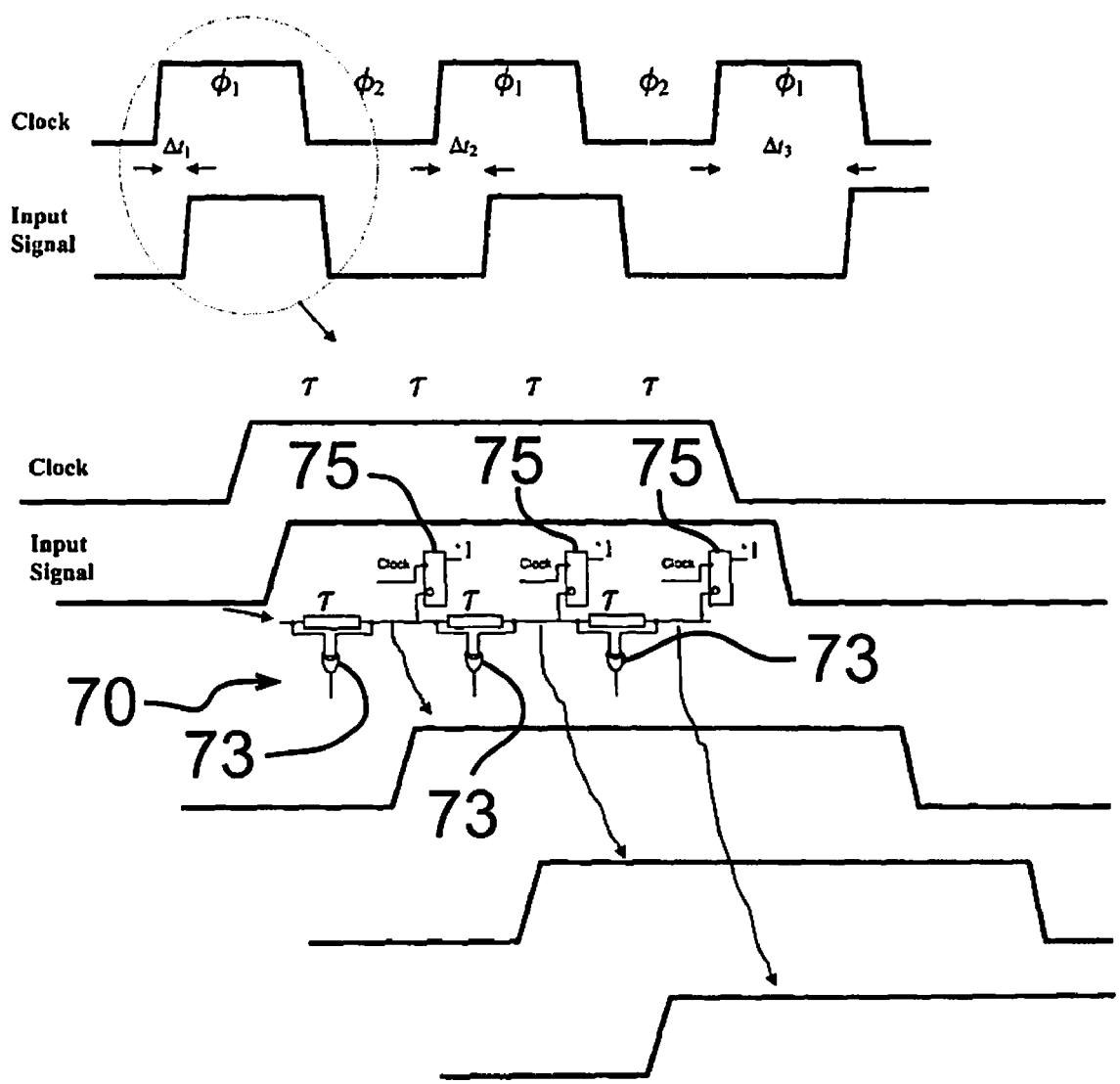
FIG. 12 shows an embodiment of top level signal processing.

FIG. 12 shows an example where the upper delay hierarchy is split into four equal time segments. Therefore, 2 TDC output bits can be generated at this level. In this figure, $\Delta t_1$, $\Delta t_2$, and $\Delta t_3$ are three time differences between the clock and the input signal. By looking into the first case ($\Delta t_1 < \tau$), a 2-bit digital word can be used to represent the time difference between the input signal and the clock. In order to achieve this, three delay cells 70 are connected horizontally, with each delay cell having a $\tau$ time resolution. As the input signal propagates through the three delay cells 70, delayed copies are generated at the output of the delay elements. The output states of the latches 75 will determine the code corresponding to each of the delay differences. For instance, $\Delta t_1$ is less than one delay cell time resolution ($\tau$), and therefore the outputs of the latches 75 will assume a logic '1 value. A decoder can be used to show that the output code for this case is '00. In the case where $\tau < \Delta t_2 < 2\tau$, the latch outputs should have a '110 sequence and the output code should be '01. The truth table for the decoder of FIG. 12 is shown in Table 2.

In general, the delay propagation block in FIG. 11 contains K delay resolution levels and R horizontal segments. The number of delay elements, R, conforms to equation (1).

$$R = 2^r - 1 \quad (1)$$

where r is a positive integer number representing the number of output TDC bits from the top level in the hierarchy. For instance, in FIG. 12, r equals 2. Each consecutive level has the same number of delay elements but half the resolution per delay element of the previous level. If the TDC hierarchy consists of K levels, the total number of TDC output bits can be described in Equation (2).

$$N = r + (k-1) \quad (2)$$

Both r and k are scalable with the TDC bit resolution requirements and the highest possible delay resolution for a given process technology. So far, two decoders have been described; one for a single vertical slice (as in FIG. 4) and one for the horizontal slice (as shown in FIG. 12). The last decoder needed is one that consolidates the results from all the different vertical slices (there is R slices shown in FIG. 11). At every hierarchical level (excluding the top level), this decoder reads out the result from all vertical slices and determines the final result.

In one embodiment, the conversion speed, also known as the sampling rate, is defined by the lowest resolution delay layer. If there are "n" delay circuits in the lowest resolution hierarchy layer with each delay circuit having a "t" time delay, the sampling rate is calculated as in:

$$\frac{1}{2(n \cdot t)}$$

The bit resolution of a TDC may be defined as the number of digital output bits, and for example the bit resolution "B" is calculated as in:

$$B = r + k - 1$$

where "k" is the number of delay hierarchy levels and "r" is the number of bit resolution extracted from the first level of delay hierarchy where "n" delay circuits reside, "r" can be extracted from this formula:

$$n = 2^r$$

Hence, in an embodiment of the TDC, the bit resolution "B" is scalable with the semiconductor process technology, and the power consumption is very small.

Table 1: Truth table for decoding data in FIG. 8A

TABLE 1

Truth table for decoding data in FIG. 8A

| Q2 | Q1 | Q0 | B2 | B1 | B0 |
|----|----|----|----|----|----|
| 0  | 0  | 0  | 1  | 1  | 1  |
| 0  | 0  | 1  | 1  | 0  | 0  |
| 0  | 1  | 0  | 0  | 0  | 1  |
| 0  | 1  | 1  | 0  | 1  | 0  |
| 1  | 0  | 0  | 0  | 1  | 1  |
| 1  | 0  | 1  | 0  | 0  | 0  |
| 1  | 1  | 0  | 1  | 0  | 1  |
| 1  | 1  | 1  | 1  | 1  | 0  |

Table 2: Truth table for top level decoder

TABLE 2

Truth table for top level decoder

| $Q_0$ | $Q_1$ | $Q_3$ | $B_0$ | $B_1$ |
|-------|-------|-------|-------|-------|
| 1     | 1     | 1     | 0     | 0     |
| 1     | 1     | 0     | 0     | 1     |
| 1     | 0     | 0     | 1     | 0     |
| 0     | 0     | 0     | 1     | 1     |

The TDC converter can be carried out in any suitable apparatus such as a digital signal processor programmed, hard-wired or otherwise configured to carry out the functions of the TDC converter described here. Immaterial modifications may be made to what is described here without departing from what is claimed.

What we claim:

1. A method for processing an input signal having signal edges, the method comprising the steps of:
   in respective reference signal active periods, generating a time stamp that locates a signal edge of the input signal in relation to the reference signal active period;
   generating an output bit from the time stamp; and in which generating a time stamp is carried out in a first portion of each respective reference signal active period; and
   generating an output bit from the time stamp is carried out in a second portion of each respective reference signal active period.

2. The method of claim 1 in which the time stamp locates the signal edge in relation to a falling edge of the reference signal active period.

3. A method for processing an input signal having signal edges, the method comprising the steps of:
- in respective reference signal active periods, generating a time stamp that locates a signal edge of the input signal in relation to the reference signal active period;
- generating an output bit from the time stamp; and
- in which generating the time stamp comprises applying the input signal to a hierarchical delay propagation stage, in which successive layers of the hierarchical delay propagation stage increase resolution of the time stamp.

4. The method of claim 3 in which the resolution of each successive layers increases by one-half from layer to layer.

5. The method of claim 3 in which the number of hierarchy levels is scalable with semiconductor process technology.

6. The method of claim 3 in which the number of hierarchy levels is scalable with the number of TDC output bits.

7. The method of claim 3 in which signal transition edges are created as a signal propagates through the hierarchical delay propagation stage.

8. The method of claim 7 in which each signal transition is used as a measure of how close the falling edge of a signal is to a falling edge of the reference signal active period.

9. The method of claim 3 in which signal edges are time stamped by registering their logic level at a falling edge of the reference signal active period.

10. The method of claim 3 in which generating an output bit comprises decoding the time stamps in a decoder.

11. The method of claim 3 in which the input signal is a delay modulated signal.

12. The method of claim 3 in which the reference signal active period is the active period of a clock.

13. The method of claim 3 in which each output bit comprises a digital bit representing the digital value of the time difference between the input signal and the reference signal.

14. The method of claim 3 in which the reference signal active period is the active period of a clock and the time period for the time difference to be converted to a digital output is less than or equal to one clock cycle.

15. The method of claim 1 in which generating an output bit comprises decoding the time stamps in a decoder.

16. A method for processing an input signal having signal edges, the method comprising the steps of:
- in respective reference signal active periods, generating a time stamp that locates a signal edge of the input signal in relation to the reference signal active period;
- generating an output bit from each time stamp by decoding the respective time stamp in a decoder, and in which;
- the time stamps are generated by latches, and the decoder is connected to the latches.

17. The method of claim 1 in which the input signal is a delay modulated signal.

18. The method of claim 1 in which the reference signal active period is the active period of a clock.

19. The method of claim 1 in which the outputs are a digital bit stream representing the digital value of the time difference between the input signal and the reference signal.

20. A method for processing an input signal having signal edges, the method comprising the steps of:
- in respective reference signal active periods, generating a time stamp that locates a signal edge of the input signal in relation to the reference signal active period;
- generating an output bit from the time stamp, and in which;
- the reference signal active period is the active period of a clock and the time period for the time difference to be converted to a digital output is less than or equal to one clock cycle.

21. The method of claim 1 applied in an analog to digital converter or high speed measurement device.

22. Apparatus configured to carry out the method steps of claim 1.

23. A time to digital converter, comprising:
- a delay propagation stage connected to an input signal and having time stamps as output, the time stamps being representative of the location of edges of the input signal in relation to a reference signal;
- a decoder connected to receive the time stamps and generate output bits; and
- in which the delay propagation stage operates to locate a signal edge within a first portion of an active period of the reference signal and the decoder operates within a second portion of the active period to decode the time stamps generated within the first portion of the active period.

* * * * *